US012630479B2

(12) United States Patent
Kim et al.

(10) Patent No.: US 12,630,479 B2
(45) Date of Patent: *May 19, 2026

(54) SINTERED MATERIAL, SEMICONDUCTOR MANUFACTURING APPARATUS INCLUDING THE SAME, AND METHOD OF MANUFACTURING THE SINTERED MATERIAL

(71) Applicant: SAMSUNG ELECTRONICS CO., LTD., Suwon-si (KR)

(72) Inventors: Changhwan Kim, Suwon-si (KR); Takafumi Noguchi, Kanagawa (JP); Toshihiro Iizuka, Kanagawa (JP); Younseon Wang, Suwon-si (KR); Kenichi Nagayama, Kanagawa (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 555 days.

This patent is subject to a terminal disclaimer.

(21) Appl. No.: 18/076,062

(22) Filed: Dec. 6, 2022

(65) Prior Publication Data

US 2023/0174429 A1     Jun. 8, 2023

(30) Foreign Application Priority Data

Dec. 8, 2021     (JP) ................................. 2021-199298

(51) Int. Cl.
*C04B 35/553*     (2006.01)
*C04B 35/645*     (2006.01)
*H10P 72/76*     (2026.01)

(52) U.S. Cl.
CPC .......... *C04B 35/553* (2013.01); *C04B 35/645* (2013.01); *C04B 2235/445* (2013.01);
(Continued)

(58) Field of Classification Search
CPC ........ C04B 35/5156; C04B 2235/3225; C04B 2235/604; C04B 2235/6565;
(Continued)

(56) References Cited

U.S. PATENT DOCUMENTS 9,969,652 B2     5/2018  Yano et al.
10,173,929 B2    1/2019  Fukagawa et al.
(Continued)

FOREIGN PATENT DOCUMENTS

CN          117658617 A  *  3/2024    ......... C04B 35/6455
JP          2016-98143 A      5/2016
(Continued)

OTHER PUBLICATIONS

Notice of Allowance dated Mar. 25, 2025, issued by Japanese Patent Office in Japanese Patent Application No. 2021-199298.
(Continued)

*Primary Examiner* — Jeffrie R Lund
(74) *Attorney, Agent, or Firm* — Sughrue Mion, PLLC

(57)          ABSTRACT

Provided are a sintered material having high corrosion resistance, a method of manufacturing the sintered material, a member for a semiconductor manufacturing apparatus, a method of manufacturing a member for a semiconductor manufacturing apparatus, a semiconductor manufacturing apparatus, and a method of manufacturing a semiconductor manufacturing apparatus. The sintered material according to an embodiment includes 50 mass % or more of yttrium oxyfluoride, has a relative density of 97.0% or more, and has a Vickers hardness of 5.0 GPa or more. The method of manufacturing a sintered material according to an embodiment includes forming a molded body including yttrium oxyfluoride powder having a particle size of 0.3 μm or less, and sintering the molded body under an atmospheric pressure at a temperature of 800° C. or less.

19 Claims, 12 Drawing Sheets

(52) U.S. Cl.
CPC ............... *C04B 2235/5436* (2013.01); *C04B 2235/5445* (2013.01); *C04B 2235/656* (2013.01); *C04B 2235/666* (2013.01); *C04B 2235/76* (2013.01); *C04B 2235/77* (2013.01); *C04B 2235/786* (2013.01); *H10P 72/7616* (2026.01)

(58) Field of Classification Search
CPC ...... C04B 2235/6567; C04B 2235/785; C04B 2235/80; C04B 2235/96; C04B 2235/9684; C04B 35/50; C04B 35/64; C04B 2235/668; C04B 35/553; C04B 35/645; C04B 2235/445; C04B 2235/5436; C04B 2235/5445; C04B 2235/656; C04B 2235/666; C04B 2235/76; C04B 2235/77; C04B 2235/786; C04B 35/638; C04B 2235/6581; C04B 2235/6562; C04B 2235/6586; H01J 37/3244; H01J 37/32642; H01L 21/67069; H01L 21/68757
See application file for complete search history.

(56) References Cited

U.S. PATENT DOCUMENTS

| | | | | |
|---|---|---|---|---|
| 12,492,464 | B2 * | 12/2025 | Fenwick | ............. C23C 14/0694 |
| 2017/0018408 | A1 | 1/2017 | Xu et al. | |
| 2017/0292182 | A1 * | 10/2017 | Hamaya | .................... C23C 4/02 |
| 2017/0305796 | A1 * | 10/2017 | Yano | ................... H01L 21/3065 |
| 2018/0016193 | A1 * | 1/2018 | Fukagawa | .................. B01J 2/00 |
| 2018/0127319 | A1 * | 5/2018 | Ashizawa | ............... C04B 41/87 |
| 2019/0127280 | A1 * | 5/2019 | Zhan | .................. C04B 35/6325 |
| 2019/0326101 | A1 * | 10/2019 | Ueda | ................. H01J 37/32495 |
| 2019/0345069 | A1 * | 11/2019 | Kajino | ................. C01F 17/259 |
| 2020/0095687 | A1 * | 3/2020 | Park | ........................ C23C 4/137 |
| 2021/0017036 | A1 | 1/2021 | Sato et al. | |
| 2022/0041508 | A1 * | 2/2022 | Duan | ...................... C04B 35/10 |
| 2022/0055950 | A1 | 2/2022 | Yamaguchi et al. | |
| 2022/0162083 | A1 | 5/2022 | Kim et al. | |
| 2023/0062876 | A1 * | 3/2023 | Bang | ........................ C23C 4/04 |
| 2023/0174429 | A1 * | 6/2023 | Kim | ...................... C04B 35/645 |
| | | | | 156/345.3 |
| 2024/0212990 | A1 * | 6/2024 | Sugiyama | ......... H01L 21/67069 |
| 2024/0253118 | A1 * | 8/2024 | Kim | ........................... B22F 3/03 |
| 2026/0008725 | A1 * | 1/2026 | Zhan | .................... C04B 35/505 |

FOREIGN PATENT DOCUMENTS

| | | | | |
|---|---|---|---|---|
| JP | 2016-153369 A | | 8/2016 | |
| JP | WO2016/140159 A1 | | 9/2016 | |
| JP | 2017-28268 A | | 2/2017 | |
| JP | 2019-69876 A | | 5/2019 | |
| JP | 2020-190032 A | | 11/2020 | |
| JP | 2022-83511 A | | 6/2022 | |
| JP | 7283026 B1 | * | 5/2023 | ........... C01F 17/259 |
| TW | 1888911 B | * | 7/2025 | |
| WO | 2018/083854 A1 | | 5/2018 | |
| WO | 2020/179296 A1 | | 9/2020 | |
| WO | WO-2023162290 A1 | * | 8/2023 | ........... C04B 35/645 |

OTHER PUBLICATIONS

"Fabrication of dense yttrium oxyfluoride ceramics by hot pressing and their mechanical, thermal, and electrical properties", Japanese Journal of Applied Physics 57, 06JF04, https://doi.org/10.7567/JJAP.57.06JF04, 2018, (10 total pages).

K. Miyashita et al., "Fluorine and oxygen plasma exposure behavior of yttrium oxyfluoride ceramics", Japanese Journal of Applied Physics 58, SEEC01, https://doi.org/10.7567/1347-4065/ab1636, 2019, (10 total pages).

"Characteristics of Kyocera Fine Ceramics", the New Value Fronteir Kyocera, https://www.kyocera.co.jp/prdct/fc/index.html, 2021, (5 total pages).

M. Kiyohara et al., "Development of Low Dust Generating Members with Excellent Plasma Resistance", No. 6, pp. 490-491, 2015, (10 total pages).

K. Aminaka et al., "Effect of Rare Earth Additives on Transparency of α-SiAION Ceramics", The Ceramic Society of Japan, 2F27, 2020, (5 total pages).

\* cited by examiner

FIG. 6

| EXAMPLE | MANUFACTURING CONDITION | | | | | | EVALUATION RESULT | | | |
| | RAW MATERIAL POWDER | ATMOSPHERIC PRESSURE SINTERING | | | | OVERALL EVALUATION * | RELATIVE DENSITY (%) | HARDNESS (GPa) | DIELECTRIC DISSIPATION FACTOR tan δ (x10−4) at 1 MHz | PARTICLE SIZE (μm) |
| | | ATMOSPHERE | TEMPERATURE INCREASING RATE (℃/h) | HOLDING TEMPERATURE (℃) | HOLDING TIME (h) | | | | | |
| EMBODIMENT 1 | A | VACUUM | 1000 | 800 | 10 | ◎ | 99.4 | 6.3 | <1 | 0.60 |
| COMPARATIVE EXAMPLE 1 | B | VACUUM | 1000 | 900 | 10 | × | 96.7 | 3.6 | <1 | 1.47 |
| COMPARATIVE EXAMPLE 2 | C | VACUUM | 1000 | 750 | 10 | × | 90.4 | 3.0 | 720 | 0.65 |
| COMPARATIVE EXAMPLE 3 | C | VACUUM | 1000 | 800 | 10 | × | 96.3 | 4.4 | <1 | 0.73 |
| EMBODIMENT 2 | C | VACUUM | 1000 | 825 | 10 | ○ | 99.7 | 5.5 | <1 | 1.11 |
| EMBODIMENT 3 | C | VACUUM | 1000 | 850 | 10 | ○ | 99.7 | 5.0 | <1 | 1.27 |
| COMPARATIVE EXAMPLE 4 | C | VACUUM | 1000 | 900 | 10 | × | 99.9 | 4.2 | <1 | 1.72 |

FIG. 7

| EXAMPLE | MANUFACTURING CONDITION | | | | | | | EVALUATION RESULT | | | | |
| | RAW MATERIAL POWDER | SPS CONDITION | | | | | | OVERALL EVALUATION * | RELATIVE DENSITY (%) | HARDNESS (GPa) | DIELECTRIC DISSIPATION FACTOR tan δ (×10-4) at 1 MHz | PARTICLE SIZE (µm) |
| | | ATMOSPHERE | TEMPERATURE INCREASING RATE (°C/min) | HOLDING TEMPERATURE (°C) | HOLDING TIME (min) | TEMPERATURE DECREASING RATE (°C/min) | PRESSURE (MPa) | | | | | |
|---|---|---|---|---|---|---|---|---|---|---|---|---|
| COMPARATIVE EXAMPLE 5 | A | VACUUM | 100 | 750 | 60 | 50 | 40 | × | 95.8 | 5.6 | 7.6 | 0.28 |
| EMBODIMENT 4 | A | VACUUM | 100 | 800 | 60 | 10 | 40 | ◎ | 99.6 | 7.3 | <1 | 0.52 |
| EMBODIMENT 5 | A | VACUUM | 100 | 800 | 60 | 50 | 40 | ◎ | 99.4 | 7.5 | <1 | 0.45 |
| EMBODIMENT 6 | A | VACUUM | 100 | 800 | 60 | 50 | 40 | ◎ | 99.2 | 6.8 | <1 | 1.05 |
| EMBODIMENT 7 | A | VACUUM | 100 | 800 | 60 | FURNACE COOLING | 40 | ◎ | 99.3 | 7.6 | <1 | 0.37 |
| EMBODIMENT 8 | A | Ar | 100 | 800 | 60 | 50 | 40 | ○ | 99.2 | 5.8 | <1 | 1.15 |
| EMBODIMENT 9 | A | VACUUM | 100 | 850 | 60 | 50 | 40 | ◎ | 99.8 | 6.9 | <1 | 0.55 |
| COMPARATIVE EXAMPLE 6 | B | VACUUM | 100 | 800 | 60 | 50 | 40 | × | 96.8 | 3.5 | <1 | 0.89 |
| EMBODIMENT 10 | B | VACUUM | 100 | 850 | 60 | 50 | 40 | ○ | 98.4 | 5.2 | <1 | 0.86 |
| COMPARATIVE EXAMPLE 7 | B | VACUUM | 100 | 900 | 60 | 50 | 40 | × | 98.9 | 4.0 | <1 | 3.35 |
| EMBODIMENT 11 | C | VACUUM | 100 | 900 | 60 | 50 | 40 | ◎ | 99.0 | 5.1 | <1 | 1.07 |

FIG. 8

| EXAMPLE | MANUFACTURING CONDITION | | | | | | | OVERALL EVALUATION * | EVALUATION RESULT | | | |
|---|---|---|---|---|---|---|---|---|---|---|---|---|
| | RAW MATERIAL POWDER | HOT PRESS MOLDING CONDITION | | | | | | | RELATIVE DENSITY (%) | HARDNESS (GPa) | DIELECTRIC DISSIPATION FACTOR tan δ (x10-4) at 1 MHz | PARTICLE SIZE (μm) |
| | | ATMOSPHERE | TEMPERATURE INCREASING RATE (°C/min) | HOLDING TEMPERATURE (°C) | HOLDING TIME (min) | TEMPERATURE DECREASING RATE (°C/min) | PRESSURE (MPa) | | | | | |
| EMBODIMENT 12 | A | VACUUM | 10 | 700 | 300 | 10 | 36.7 | ◎ | 98.1 | 7.0 | 5.4 | 0.32 |
| EMBODIMENT 13 | A | VACUUM | 10 | 750 | 300 | 10 | 36.7 | ◎ | 99.9 | 6.6 | <1 | 0.41 |
| EMBODIMENT 14 | A | VACUUM | 10 | 800 | 300 | 10 | 36.7 | ◎ | 100.0 | 6.7 | <1 | 0.42 |
| COMPARATIVE EXAMPLE 8 | B | VACUUM | 10 | 750 | 300 | 10 | 36.7 | × | 94.0 | 5.1 | 160 | 0.41 |
| EMBODIMENT 15 | B | VACUUM | 10 | 780 | 300 | 10 | 36.7 | ○ | 98.4 | 6.0 | <1 | 0.57 |
| EMBODIMENT 16 | B | VACUUM | 10 | 800 | 300 | 10 | 36.7 | ○ | 99.4 | 5.0 | <1 | 0.71 |
| EMBODIMENT 17 | B | VACUUM | 10 | 850 | 300 | 10 | 36.7 | ○ | 100.0 | 5.0 | <1 | 0.89 |
| COMPARATIVE EXAMPLE 9 | B | VACUUM | 10 | 900 | 60 | 10 | 36.7 | × | 99.9 | 4.6 | <1 | 0.79 |
| COMPARATIVE EXAMPLE 10 | B | VACUUM | 10 | 900 | 180 | 10 | 36.7 | × | 100.0 | 4.4 | <1 | 0.97 |
| COMPARATIVE EXAMPLE 11 | C | VACUUM | 10 | 700 | 300 | 10 | 36.7 | × | 96.2 | 5.3 | 73 | 0.47 |
| EMBODIMENT 18 | C | VACUUM | 10 | 750 | 300 | 10 | 36.7 | ○ | 99.6 | 5.8 | <1 | 0.47 |
| EMBODIMENT 19 | C | VACUUM | 10 | 800 | 300 | 10 | 36.7 | ○ | 99.8 | 5.1 | <1 | 0.49 |
| COMPARATIVE EXAMPLE 12 | C | VACUUM | 10 | 850 | 300 | 10 | 36.7 | × | 99.9 | 4.7 | <1 | 0.97 |
| COMPARATIVE EXAMPLE 13 | C | VACUUM | 10 | 900 | 60 | 10 | 36.7 | × | 99.7 | 4.1 | <1 | 1.07 |
| COMPARATIVE EXAMPLE 14 | C | VACUUM | 10 | 900 | 180 | 10 | 36.7 | × | 99.8 | 4.2 | <1 | 0.91 |

FIG. 9

| MANUFACTURING CONDITION | SAMPLE | | | | | PLASMA RESISTANCE TEST RESULT | |
|---|---|---|---|---|---|---|---|
| SINTERING METHOD | RAW MATERIAL POWDER | RELATIVE DENSITY (%) | HARDNESS (GPa) | $\tan\delta$ ($\times 10^{-4}$) at 1 MHz | | ETCHING AMOUNT (um) | RA DETERIORATION RATE |
| EMBODIMENT 2 — ATMOSPHERIC PRESSURE SINTERING | C | 99.7 | 5.0 | <1 | | 12.333 | 12.99 |
| EMBODIMENT 4 — SPS | A | 99.6 | 7.3 | <1 | | 12.196 | 2.86 |
| EMBODIMENT 6 — SPS | A | 99.2 | 6.8 | <1 | | 12.492 | 2.53 |
| EMBODIMENT 7 — SPS | A | 99.3 | 7.6 | <1 | | 9.988 | 3.40 |
| EMBODIMENT 12 — HP | A | 98.1 | 7.0 | 5.4 | | 11.864 | 4.84 |
| EMBODIMENT 13 — HP | A | 99.9 | 6.6 | <1 | | 11.692 | 3.50 |
| EMBODIMENT 14 — HP | A | 100.0 | 6.7 | <1 | | 11.979 | 3.45 |
| EMBODIMENT 17 — HP | B | 100.0 | 5.0 | <1 | | 10.701 | 5.39 |
| EMBODIMENT 18 — HP | C | 99.6 | 5.8 | <1 | | 12.518 | 14.63 |
| COMPARATIVE EXAMPLE 4 — ATMOSPHERIC PRESSURE SINTERING | C | 99.9 | 4.2 | <1 | | 12.874 | 21.20 |
| COMPARATIVE EXAMPLE 10 — HP | B | 100.0 | 4.4 | <1 | | 13.020 | 23.89 |
| COMPARATIVE EXAMPLE 11 — HP | C | 96.2 | 5.3 | <1 | | 14.189 | 68.92 |
| COMPARATIVE EXAMPLE 12 — HP | C | 99.9 | 4.7 | <1 | | 13.861 | 28.20 |
| COMPARATIVE EXAMPLE 15 — HP | $Y_2O_3$ | >99 | 6.0 | 5 | | 12.137 | 17.70 |

SINTERED MATERIAL, SEMICONDUCTOR MANUFACTURING APPARATUS INCLUDING THE SAME, AND METHOD OF MANUFACTURING THE SINTERED MATERIAL

CROSS-REFERENCE TO RELATED APPLICATIONS

This application is based on and claims priority to Japanese Patent Application No. 2021-199298, filed on Dec. 8, 2021, the disclosure of which is incorporated by reference herein in its entirety.

BACKGROUND

The present disclosure relates to a sintered material, a method of manufacturing the sintered material, a member for a plasma apparatus, a method of manufacturing a member for a semiconductor manufacturing apparatus, and a method of manufacturing the semiconductor manufacturing apparatus.

With the miniaturization of semiconductors, a low-pollution manufacturing process is strongly needed. The influence of particles due to dust generation in semiconductor manufacturing apparatuses, particularly plasma apparatuses, has become a serious problem. A plasma apparatus includes, for example, a dry etching apparatus, a plasma chemical vapor deposition (CVD) apparatus, or the like. Particles may be generated when an etching gas or material gas based on a halogen group corrodes inner walls or internal parts of a chamber. For this reason, corrosion resistance is required for a member used for semiconductor manufacturing apparatuses including plasma apparatuses. So far, alumina has been used as a corrosion-resistant material. Recently, a technique using yttrium oxide, such as $Y_2O_3$, which has a high corrosion resistance, has been practically utilized.

In Patent Document 1 and Non-Patent Document 1, sintered materials, such as $Y_5O_4F_7$, are described as corrosion-resistant materials. Patent Document 1 and Non-Patent Document 1 disclose methods of obtaining a dense sintered material of 99.0% or more.

LITERATURE REFERENCES

Non-Patent Document 1: "Fabrication of dense yttrium oxyfluoride ceramics by hot pressing and their mechanical, thermal, and electrical properties", Japanese Journal of Applied Physics 57, 06JF04 (2018)

Non-Patent Document 2: "Fluorine and oxygen plasma exposure behavior of yttrium oxyfluoride ceramics", Japanese Journal of Applied Physics 58, SEEC01 (2019)

Non-Patent Document 3: "Development of a low dust generation member with high plasma resistance", Ceramic 50 (2015) No. 6, 490-491

Non-Patent Document 4: "CHARACTERISTICS OF KYOCERA FINE CERAMICS" [online], Kyocera Co., [Searched on Nov. 1, 2021], Internet <https://www.kyocera.co.jp/prdct/fc/product/pdf/material.pdf>

Non-Patent Document 5: "Effect of Rare Earth Additives on Transparency of a-SiAlON Ceramics", Preliminary Collection of Lectures for the 33rd Fall Symposium (Lecture No. 2F27)

Patent Document 1: Japanese Patent Application Laid-Open No. 2016-098143

Corrosion by plasma is mainly caused by two factors, that is, chemical action and physical action.

Corrosion by chemical action proceeds mainly by a chemical reaction with an etching gas. Radicals generated by activation of the etching gas by plasma cause a chemical reaction with members in a chamber, leading to corrosion. In order to suppress chemical corrosion, a material that does not chemically react with an etching gas easily may be selected as a corrosion-resistant material. From that point of view, rare earth compounds, such as $Y_2O_3$, are selected. Rare earth compounds generally have low reactivity with halogen compounds used as etching gases. Furthermore, when a rare-earth compound and a halogen compound react, a rare-earth halide, which is a reaction product, generally has a high boiling point, and thus, tends to remain on a surface of a member in a chamber as it is. As a result, it is difficult for corrosion to proceed into the inside of the member in the chamber.

On the other hand, corrosion by physical action mainly proceeds by sputtering action by an etching gas. The etching gas is ionized by plasma, and the ions collide with the member in the chamber by a potential difference and sputter the member in the chamber, and thus, corrosion by physical action proceeds. Therefore, in order to develop a high corrosion-resistant material, the corrosion-resistant material needs to be examined from the viewpoints of chemical corrosion and physical corrosion.

Non-Patent Document 1 discloses a material superior to $Y_2O_3$ from a viewpoint of preventing chemical corrosion. In Non-Patent Document 1, it has been pointed out that, when a member including $Y_2O_3$ is exposed to plasma of a fluorine-based gas, a modified layer by fluorination is formed on a surface thereof. On the other hand, because a member including oxyfluoride of yttrium, for example, $Y_5O_4F_7$ or YOF, originally includes fluorine, it is difficult to form such a modified layer. Therefore, yttrium oxyfluoride may be expected as a next-generation corrosion-resistant material replacing $Y_2O_3$. Furthermore, in Non-Patent Document 1, it is reported that a member including $Y_5O_4F_7$ exhibits less change in surface roughness before and after etching with a halogen-based gas than a member including $Y_2O_3$. In addition, it is suggested that the member including $Y_5O_4F_7$ produces a smaller amount of particles and the size thereof is less than that of the member including $Y_2O_3$. Therefore, it may be stated that the member including yttrium oxyfluoride is superior to the member including $Y_2O_3$.

In Non-Patent Document 3, a result of evaluating the plasma resistance of $Y_2O_3$ manufactured with different methods is disclosed from the viewpoint of preventing physical corrosion. According to Non-Patent Document 3, it is reported that $Y_2O_3$ formed by an AD method with greater Vickers hardness has a smaller change in etching depth and a smaller change in surface roughness compared to other manufacturing methods, and plasma resistance is high. This result suggests that physical corrosion may be reduced even in the same material if the hardness is high.

The higher hardness is also superior from viewpoints other than plasma resistance as a member of semiconductor manufacturing apparatuses. If the hardness is small, scratches are likely to occur on a surface of the member during assembly or maintenance of the apparatus. When a generated scratch is exposed to plasma, problems, for example, abnormal discharge or generation of particles, may occur, which is undesirable.

Non-Patent Document 2 also discloses a measurement result of an etching depth before and after etching with a halogen-based gas with respect to $Y_5O_4F_7$, $Y_2O_3$, and YOF.

It may be expected that the etching depth of $Y_5O_4F_7$, which has little chemical corrosion, is small, but no clear difference was found with respect to the above three materials. In Non-Patent Document 4, it is disclosed that a Vickers hardness of $Y_2O_3$ is 6.0 GPa. On the other hand, in Non-Patent Document 1, it is disclosed that the Vickers hardness of $Y_5O_4F_7$ is 0.491 GPa, which is less than that of $Y_2O_3$. It is suggested that $Y_5O_4F_7$ has less chemical corrosion and greater physical corrosion than $Y_2O_3$. This is considered to be a factor regarding why the etching depth became equal with respect to $Y_5O_4F_7$ and $Y_2O_3$.

In addition, in ceramics used for members for semiconductor manufacturing apparatuses, a dielectric dissipation factor, so-called tan δ, which is one of the electrical characteristics, is also important. When a member having a large tan δ is disposed in plasma, problems may occur, for example, the uniformity of the plasma is impaired, the member generates heat by Joule heating, and the heat affects the temperature distribution and the like. For example, in Non-Patent Document 4, it is disclosed that a value of tan δ of alumina at 1 MHz, called "part for a semiconductor apparatus", is $10 \times 10^{-4}$, which is a very small value. In Non-Patent Document 1, values of tan δ are disclosed, that is, a value of $1.5 \times 10^{-4}$ is obtained in a $Y_5O_4F_7$ sintered material at 1 MHz, and a value of $2.6 \times 10^{-4}$ is obtained in a $Y_5O_4F_7 + YF_3$ sintered material, but although sufficiently small values are obtained, the Vickers hardness remains low at 0.491 GPa and 0.614 GPa, respectively.

Therefore, when the sintered material of yttrium oxyfluoride has a high hardness, a member for semiconductor manufacturing apparatuses with high plasma resistance and a small amount of dust generation may be obtained. Furthermore, if the value of tan δ may be controlled to be small, the uniformity of the plasma may be secured.

SUMMARY

One or more embodiments provide, considering the above problems, a sintered material, a method of manufacturing the sintered material, a member for a semiconductor manufacturing apparatus, a method of manufacturing a member for the semiconductor manufacturing apparatus, a semiconductor manufacturing apparatus, and a method of manufacturing a semiconductor manufacturing apparatus, which solve at least one of the above-mentioned various drawbacks.

The sintered material according to a first aspect of an embodiment includes 50 mass % or more of yttrium oxyfluoride, has a relative density of 97.0% or more, and has a Vickers hardness of 5.0 GPa or more.

The sintered material according to a first aspect of an embodiment may further include yttrium fluoride.

The sintered material according to a first aspect of an embodiment may include 10 mass % or less of at least one of an oxide of a rare earth element, a fluoride of a rare earth element, and an oxyfluoride of a rare earth element.

In addition, the sintered material according to a first aspect of an embodiment may have a relative density of 99.0% or more.

In addition, an average particle size of crystal grains constituting the sintered material may be 1.15 μm or less.

In addition, an average particle size of crystal grains constituting the sintered material may be 1.27 μm or less, particularly where the sintered material further includes yttrium fluoride.

A dielectric dissipation factor (tan δ) measured at 1 MHz may be less than $10 \times 10^{-4}$.

A member for plasma apparatus according to a second aspect of an embodiment includes the sintered material according to a first aspect of an embodiment.

In addition, the member for a plasma apparatus may include an edge ring, a shower nozzle, or a window.

A semiconductor manufacturing apparatus according to a third aspect of an embodiment includes the member for a plasma apparatus according to a second aspect of an embodiment.

A method of manufacturing a sintered material according to a fourth aspect of an embodiment includes molding a molded body including yttrium oxyfluoride powder having a particle size of 0.3 μm or less, and forming a sintered material by sintering the molded body under atmospheric pressure at 800° C. or less.

A method of manufacturing a sintered material according to a fifth aspect of an embodiment includes molding a molded body including yttrium oxyfluoride powder and yttrium fluoride powder having a particle size of 0.5 μm or less, and forming a sintered material by sintering the molded body under atmospheric pressure at 850° C. or less.

A method of manufacturing a sintered material according to a sixth aspect of an embodiment includes forming a sintered material by sintering a raw material powder including yttrium oxyfluoride powder having a particle size of 0.5 μm or less at 850° C. or less by using a spark plasma sintering (SPS) method.

In addition, the sintered material may be formed by sintering the yttrium oxyfluoride powder having a particle size of 0.3 μm or less at 800° C. or less by using the SPS method.

A method of manufacturing a sintered material according to a seventh aspect of an embodiment includes forming a sintered material by sintering a raw material powder including yttrium oxyfluoride powder and yttrium fluoride powder having a particle size of 0.5 μm or less at 900° C. or less by using the SPS method.

A method of manufacturing a sintered material according to an eighth aspect of an embodiment includes forming a sintered material by sintering a raw material powder including yttrium oxyfluoride powder having a particle size of 0.5 μm or less at 850° C. or less by a hot press method.

In addition, the sintered material may be formed by sintering the yttrium oxyfluoride powder having a particle size of 0.3 μm or less at 800° C. or less by using the hot press method.

A method of manufacturing a sintered material according to a ninth aspect of an embodiment includes forming a sintered material by sintering a raw material powder including yttrium oxyfluoride powder and yttrium fluoride powder having a particle size of 0.5 μm or less at 800° C. or less by using the hot press method.

A method of manufacturing a member for a semiconductor manufacturing apparatus according to a tenth aspect of an embodiment further includes applying a sintered material to a member for a plasma apparatus after manufacturing a sintered material using the method of manufacturing the sintered material according to the fourth to ninth aspects of an embodiment.

In addition, the member for a plasma apparatus may include an edge ring, a shower nozzle, or a window.

A method of manufacturing a semiconductor manufacturing apparatus according to an eleventh aspect of an embodiment further includes applying a member for a semiconductor manufacturing apparatus to a semiconductor manufacturing apparatus after manufacturing the member for a semiconductor manufacturing apparatus by using the method of manufacturing a member according to the tenth aspect of an embodiment.

BRIEF DESCRIPTION OF THE DRAWINGS

The above and other aspects and features will be more clearly understood from the following description, taken in conjunction with the accompanying drawings, in which:

FIG. 6 is a table showing manufacturing conditions for manufacturing a sintered material using an example of the method of manufacturing the sintered material according to a first aspect of an embodiment and evaluation results:

FIG. 7 is a table showing manufacturing conditions for manufacturing a sintered material using an example of the method of manufacturing the sintered material according to a second aspect of an embodiment and evaluation results:

FIG. 8 is a table showing manufacturing conditions for manufacturing a sintered material using an example of the method of manufacturing a sintered material according to a third aspect of an embodiment and evaluation results:

FIG. 9 is a table showing plasma resistance test results of a sintered material manufactured by using each example of a method of manufacturing a sintered material according to first to third aspects of an embodiment;

DETAILED DESCRIPTION

Embodiment I

Figure 1:
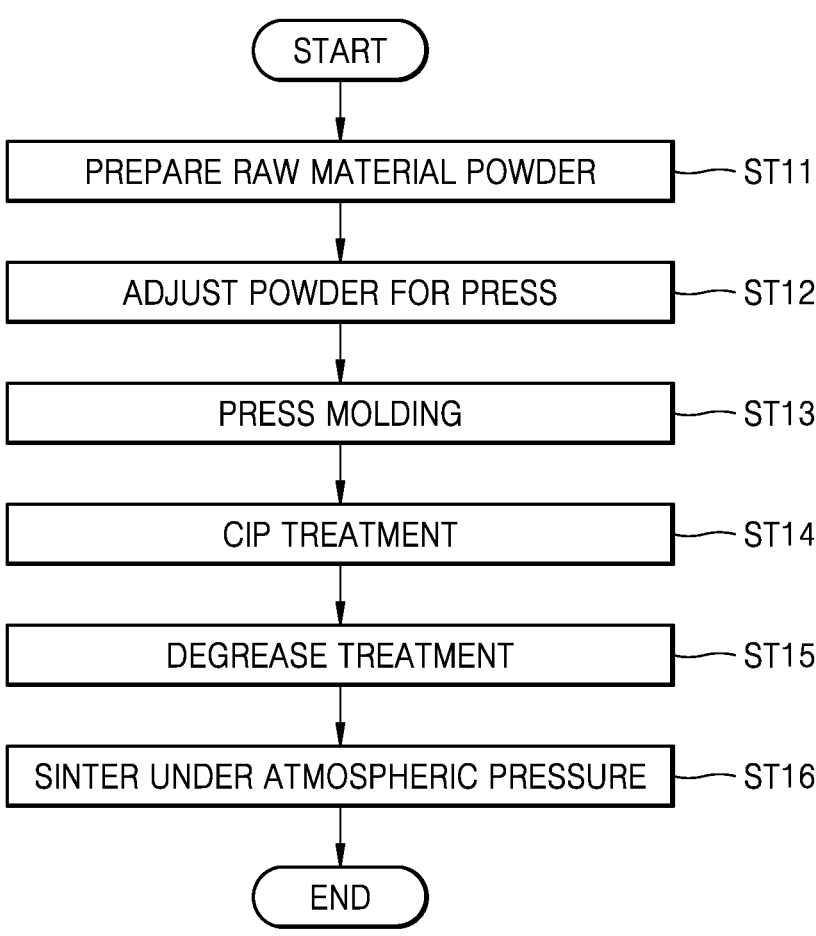
FIG. 1 is a flowchart of a method of manufacturing a sintered material according to a first aspect of an embodiment.

Hereinafter, a method of manufacturing a sintered material according to Embodiment I is described with reference to FIG. 1.

<Outline of Sintered Material>

A sintered material according to Embodiment I includes 50 mass % or more of yttrium oxyfluoride, has a relative density of 97.0% or more, and has a Vickers hardness of 5.0 GPa or more. The yttrium oxyfluoride may be expressed as $Y_xO_yF_z$ ($x \neq y \neq z$), and x, y and z may be arbitrarily set, y is less than x, and a value of z/y may be 1.5 or more and 1.75 or less. In addition, a crystal system may be orthorhombic. In addition, the oxyfluoride of yttrium includes, for example, at least one type of $Y_5O_4F_7$, $Y_6O_5F_8$, $Y_7O_6F_9$, $Y_{17}O_{14}F_{23}$, and $Y_1O_{0.826}F_{1.348}$. Because such a sintered material includes 50 mass % or more of yttrium oxyfluoride, chemical corrosion is less compared with a sintered material including $Y_2O_3$. Because the sintered material has a relative density of 97.0% or more and has few voids, the sintered material has good plasma resistance. Because the sintered material has a Vickers hardness of 5.0 GPa or more, the sintered material has good plasma resistance, and furthermore, it is hard to generate flaws on a surface thereof. Due to the above, the sintered material has high corrosion resistance.

<Method of Manufacturing a Sintered Material by Atmospheric Pressure Sintering>

A raw material powder is prepared (operation ST11). The raw material powder is, for example, $Y_5O_4F_7$ powder or a mixed powder of $Y_5O_4F_7$ and $YF_3$. A particle size is, for example, in a range from about 0.3 μm to about 0.5 μm. A weight ratio is set to a certain value for the mixed powder of $Y_5O_4F_7$ and $YF_3$. The $Y_5O_4F_7$ powder is a kind of yttrium oxyfluoride powder. The details of $Y_5O_4F_7$ and yttrium oxyfluoride powder are described below. In addition, the "particle size" of the raw material powder is a "median diameter (D50)" of a primary particle size measured using a particle size distribution measuring apparatus by a laser diffraction-scattering method, for example, MT3300 manufactured by MICROTRAC.

Next, a powder to be pressed is obtained by preparing the raw material powder (operation ST12). A binder-added slurry is produced by mixing the raw material powder, a solvent, a dispersant, and a binder. The solvent is removed from the binder-added slurry, for example, by freeze-drying or spray-drying the binder-added slurry. Thereby, the powder to be pressed is acquired.

Next, the powder is press-molded to obtain a molded body (operation ST13). Specifically, for example, the powder is put into a mold. The molded body is formed by applying pressure to the powder using a hydraulic press. Thus, the molded body is obtained by separation from the mold.

Next, the molded body is subjected to a cold isostatic pressing (CIP) treatment (operation ST14). The CIP treatment may be omitted in some embodiments.

Next, the binder component is removed by degreasing the CIP-treated molded body or a press-treated molded body by heating, etc. (operation ST15).

Finally, a sintered material is manufactured by sintering the degreasing-treated molded body under an atmospheric pressure (which can be a vacuum of about $10^{-3}$ Pa, as indicated below) (operation ST16). Specifically, the degreasing-treated molded body is heated in a preset gas atmosphere (preset flow rate) at a preset temperature for a preset time. The degreasing-treated molded body may be put into an alumina crucible which is then covered with a lid, and the degreasing-treated molded body may be sintered under various conditions using an electric furnace. The sintering conditions may be set such that, for example, the atmosphere is vacuum (about $10^{-3}$ Pa), the temperature increasing rate is 1000° C./hour (° C./h), the holding temperature is in a range from about 750° C. to about 1000° C., the holding time is in a range from about 1 to about 10 hours, and the temperature decreasing rate is set to furnace cooling, respectively. The upper limit of a range of the holding temperature may be selected from any one of 850° C., 825° C., or 800° C.

Embodiment II

<Method of Manufacturing a Sintered Material by Spark Plasma Sintering>

Figure 2:
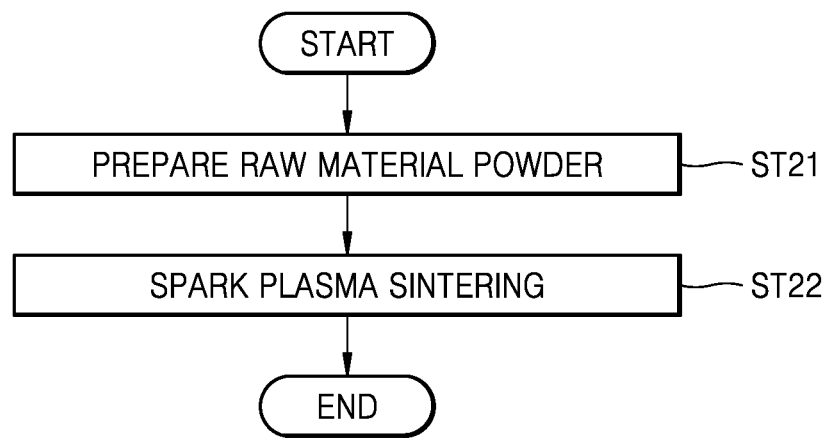
FIG. 2 is a flowchart of a method of manufacturing a sintered material according to a second aspect of an embodiment.
Figure 3:
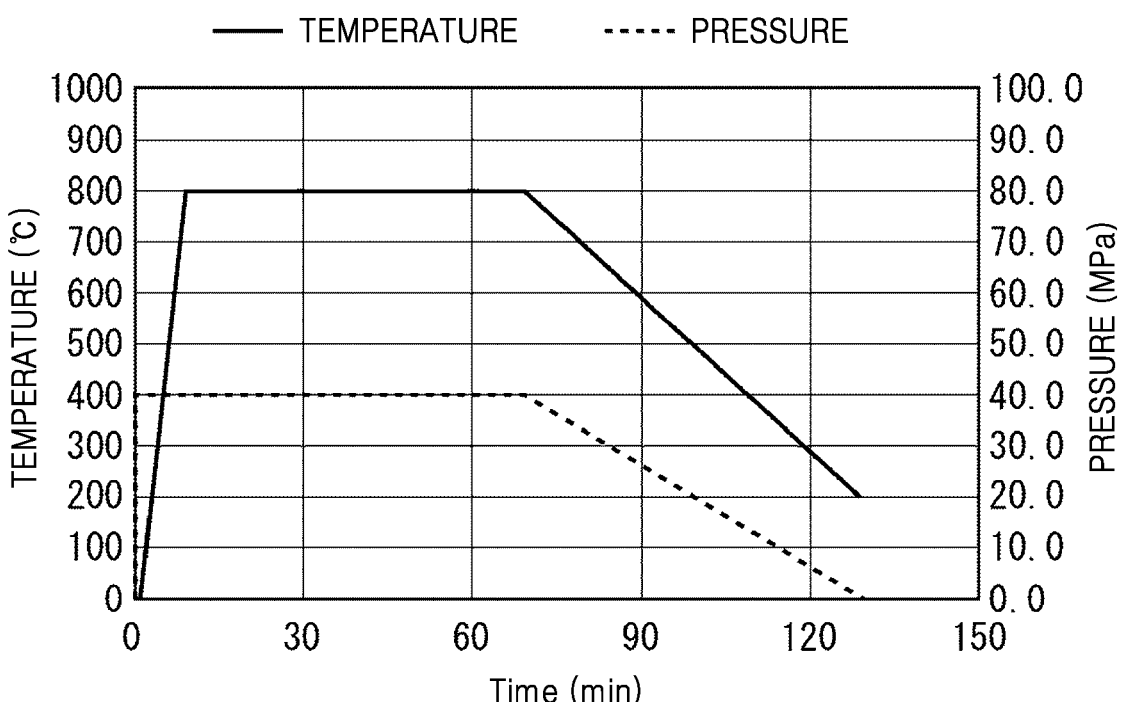
FIG. 3 is a graph showing an example of a temperature and pressure profile in a method of manufacturing a sintered material according to a second aspect of an embodiment.

Next, with reference to FIG. 2 and FIG. 3, a method of manufacturing a sintered material according to Embodiment II is described.

A raw material powder is prepared (operation ST21). Operation ST21 may be the same as operation ST11.

Next, the prepared raw material powder is sintered by using a spark plasma sintering (SPS) method to manufacture a sintered material (operation ST22). "SPS method" is an abbreviation for Spark Plasma Sintering method. The sintering of a work piece is performed by mechanical pressurization and pulsed electric current heating. In general, sintering by the SPS method may be able to densify the work piece at a low temperature and in a short time, and it may be stated that the work piece may be densified by suppressing grain growth. Specifically, the raw material powder is put in a mold and sintered under various conditions using an SPS apparatus. The sintering conditions are atmospheric pressure, temperature increase rate, holding temperature, holding time, temperature decreasing rate, holding pressure, and the like. FIG. 3 is a graph showing an example of the temperature and pressure profile (for Embodiment 4 described in the table in FIG. 7) in one process of a method of manufacturing a sintered material according to Embodiment II. A range of the holding temperature may be set, for example, in a range from about 750° C. to about 1000° C. The upper limit of the range of the holding temperature may be selected from any one of 1000° C., 850° C., and 800° C.

Embodiment III

<Method of Manufacturing a Sintered Material by Hot Press Molding>

Figure 4:
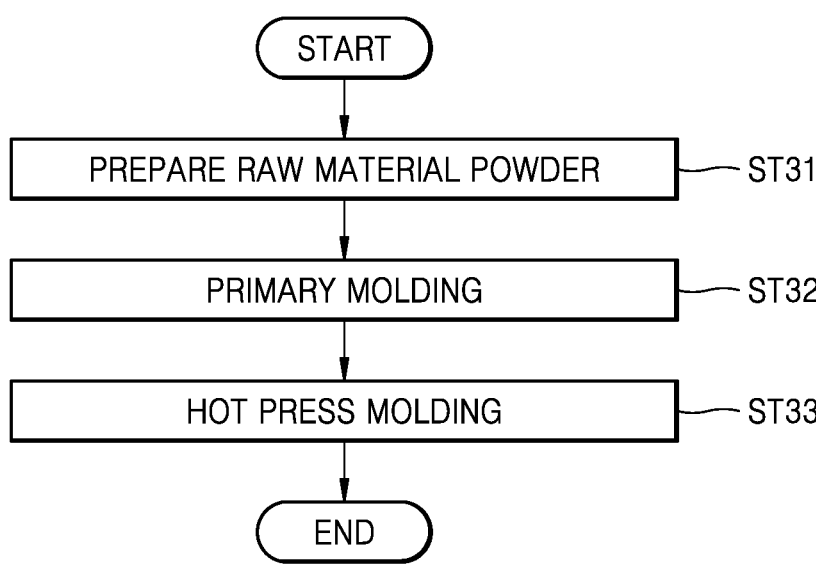
FIG. 4 is a flowchart of a method of manufacturing a sintered material according to a third aspect of an embodiment.
Figure 5:
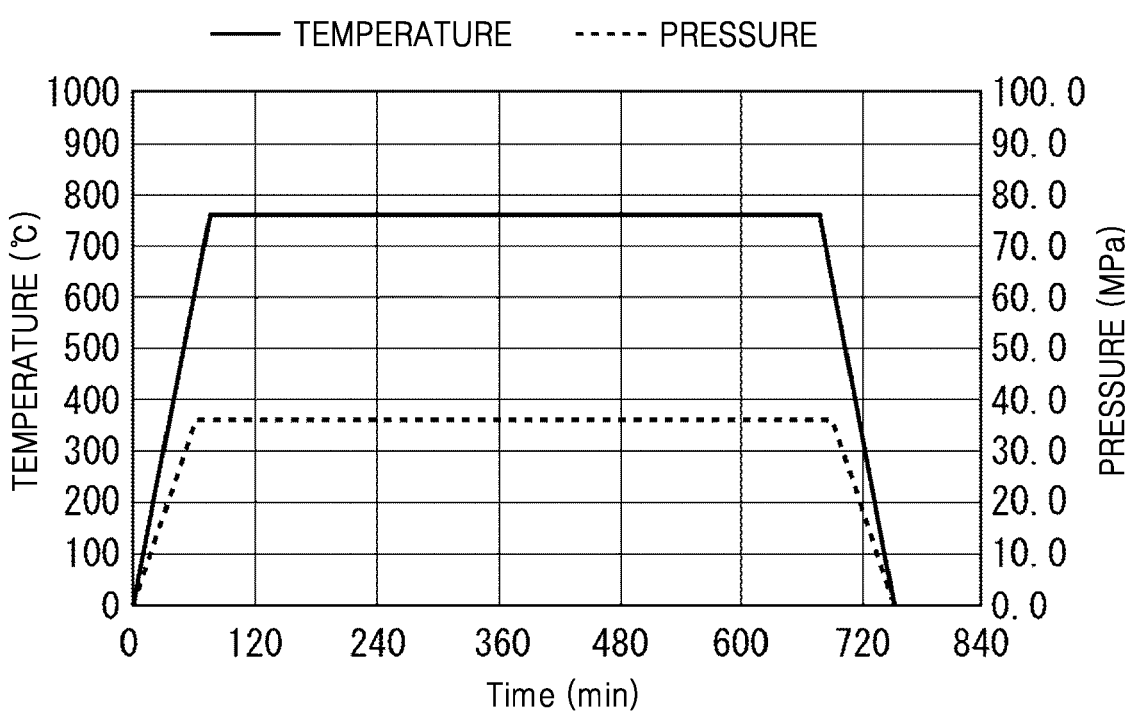
FIG. 5 is a graph showing an example of a temperature and pressure profile in a method of manufacturing a sintered material according to a third aspect of an embodiment.

Next, with reference to FIGS. 4 and 5, the method of manufacturing a sintered material according to Embodiment III is described.

A raw material powder is prepared (operation ST31). Operation ST31 is the same as operation ST11 and operation ST21.

Next, the raw material powder is primarily molded (operation ST32). Specifically, the raw material powder is put into a mold as it is. A pressure is applied to the raw material powder using a hydraulic press to form a primary molded body. The primary molded body is obtained by separation from the mold. Alternatively, without separating the primary molded body from the mold, a hot press molding like that described below may be performed using the same mold (rather than in a different mold as described below).

Finally, a sintered material is formed by hot press molding the primary molded body (operation ST33). Specifically, first, the primary molded body obtained in operation ST32 is put into a hot press mold of the same size, and is hot press molded using a molding device under various conditions. The hot press conditions are atmosphere gas, pressure, temperature increase rate, holding temperature, holding time, temperature decreasing rate, holding pressure, and the like. FIG. 5 is a graph showing an example of the temperature and pressure profile (for Embodiment 13 described in the table in FIG. 8) in one process of a method of manufacturing a sintered material according to Embodiment III. The holding temperature may be set, for example, in a range from about 700° C. to about 1000° C. Specifically, the upper limit of the range of the holding temperature may be selected from any one of 850° C., 800° C., 780° C., 750° C., and 700° C.

EXAMPLES

Next, with reference to FIGS. 6 to 9, the manufacturing of sintered materials manufactured by using a method of manufacturing a sintered material, and results of performing evaluation are described. <Manufacturing conditions of a sintered material>, <Evaluation method of a sintered material>, <Evaluation result of a sintered material> are described in order.

<Manufacturing Conditions of Sintered Material>

<1. Manufacturing Conditions of a Sintered Material by Atmospheric Pressure Sintering>

Manufacturing conditions for manufacturing a sintered material by atmospheric pressure are described. The method of manufacturing a sintered material by atmospheric pressure sintering has the same configuration as the method of manufacturing a sintered material according to Embodiment I.

In operation ST11, two types of $Y_5O_4F_7$ powder as raw material powders, a product having a particle size of 0.3 μm (hereinafter referred to as raw material powder A) and a product having a particle size of 0.5 μm (hereinafter referred to as raw material powder B), were used. Furthermore, one type of mixed powder of $Y_5O_4F_7$ and $YF_3$ and a product having a particle size of 0.5 μm in which $Y_5O_4F_7$ and $YF_3$ were mixed at a weight ratio of 60:40 (hereinafter referred to as raw material powder C) were used.

In operation ST12, first, 50 g of raw material powder A, 25 g of pure water as a solvent, 0.3 g of A-30 L manufactured by Toagosei as a dispersant, and 4.4 mL of a solution formed by dissolving 3 mL of AS-1100 manufactured by Toagosei as a binder in 12 mL of pure water were mixed in a glass container. The solution was freeze-dried and the pure water was removed to obtain powder for pressing. With respect to the raw material powders B and C, powders to be pressed were obtained by preparing by the same method.

In operation ST13, first, 8.0 g of powder to be pressed was put into a cylindrical mold having a diameter of 25 mm. A molded body was formed by applying a pressure of 25 MPa to the powder by using a hydraulic press. The molded body was obtained by separating molded body from the mold. The obtained molded body was, for example, a cylindrical body having a diameter of approximately 25 mm and a height of approximately 5.5 mm.

In operation ST14, after vacuum-packing the molded body, the molded body was pressed at a pressure of 300 MPa for 10 minutes using a Dr CIP, which is an isostatic pressurization device manufactured by KOBELCO.

In operation ST15, the CIP-treated molded body was placed on an alumina dish and degreasing was performed on the CIP-treated molded body. The binder component and the dispersant component included in the molded body were removed.

In operation ST16, the degreasing-treated molded body was heated under an atmosphere of $N_2$ (nitrogen) gas (flow rate: 0.2 L/min) at a temperature of 500° C. for 50 hours. The degreasing-treated molded body was placed in an alumina crucible, which was covered with a lid, and sintered using an electric furnace. The sintering conditions are set as, for example, the atmosphere is vacuum (about $1\times10^{-3}$ Pa), the temperature increasing rate is 1000° C./h, the holding temperature is in a range from about 750° C. to about 1000° C., the holding time is in a range from about 1 hour to about 10 hours, and the temperature decreasing rate is set to furnace cooling.

<2. Manufacturing Conditions for Manufacturing a Sintered Material by SPS Method>

Next, an example of manufacturing conditions for manufacturing a sintered material by Spark Plasma Sintering is described. A method of manufacturing a sintered material by Spark Plasma Sintering has the same configuration as the method of manufacturing a sintered material according to Embodiment II.

In operation ST21, the raw material powder A, the raw material powder B, and the raw material powder C were used as the raw material powders as in operation ST11 of the example of a method of manufacturing a sintered material according to Embodiment I.

In operation ST22, 6.4 g of raw material powder A was directly put into a cylindrical mold having a diameter of 20 mm, and sintered under various conditions using an SPS apparatus (manufactured by Fuji Denpacoki, SPS-515). Sintering conditions are set as follows. An atmosphere is under a vacuum (about 3 Pa) or Ar (argon) gas (flow rate 1 L/min), a temperature increasing rate is in a range from about 10° C./min to about 100° C./min, a holding temperature is in a range from about 750° C. to about 1000° C., a holding time is in a range from about 0 hour to about 1 hour, a temperature decreasing rate is in a range from about 2° C./min to about 50° C./min down to 200° C., and at 200° C. or lower, furnace cooling, at the same time as the temperature rise starts, the pressure rises and the holding pressure is reached in 1 minute, a holding pressure is 40 MPa, and the pressure decreasing starts at the same time as the temperature maintenance ends, and the pressure decreasing ends at a temperature of 200° C. Sintered materials for the raw material powders B and C were obtained in the same manner.

<3. Manufacturing Conditions for Manufacturing a Sintered Material by Hot Press Molding>

Next, an example of manufacturing conditions for manufacturing a sintered material by hot press molding is described. A method of manufacturing a sintered material by hot press molding has the same configuration as the method of manufacturing a sintered material according to Embodiment III.

In operation ST31, the raw material powder A, the raw material powder B, and the raw material powder C were used as the raw material powders as in operation ST11 of the example of a method of manufacturing a sintered material according to Embodiment I.

In operation ST32, 55 g of the raw material powder A was put into a cylindrical mold having a diameter of 52 mm as it is. A primary molded body was formed by applying a pressure of 18.4 MPa to the raw material powder A using a hydraulic press. The primary molded body was obtained by separating it from the mold. The primary molded body had an approximately cylindrical body shape with a diameter of approximately 52 mm and a height of approximately 12 mm. Primary molded bodies of raw material powders B and C were obtained likewise.

In operation ST33, the primary molded body obtained in operation ST32 was put into a carbon hot press mold of the same size, and hot press molded using a molding machine HP-10X10-CC-23 (manufactured by NEMS) under various conditions. The hot press conditions are set as an atmosphere is a vacuum (about $10^{-3}$ Pa) or Ar gas (flow rate 1 L/min), a temperature increasing rate is 10° C./min, a holding temperature is in a range from about 700° C. to about 1000° C., a holding time is in a range from about 1 hour to about 5 hours, a temperature decreasing rate is 10° C./min, pressure rise starts at the same time as the temperature rise starts and reaches a holding pressure in 1 hour, the holding pressure is 36.7 MPa, and the pressure decreasing is set to simultaneously end with the temperature decreasing end when pressure reaches 0 MPa in 1 hour.

<Evaluation Method of Sintered Material>

Next, the evaluation method of a sintered material is described. First, the following items are described as an evaluation method. 1. Density, 2. Hardness (Vickers hardness), 3. Electrical characteristics (dielectric dissipation factor, tan δ), 4. Compositional analysis (impurities), 5. Particle size, and 6. Plasma resistance.

<1. Density>

Using an electronic balance, a weight in air and a weight in pure water of the obtained sintered material were weighed, and a density was obtained using the Archimedes method. The obtained density was divided by a theoretical density of the sintered material (the theoretical density of $Y_5O_4F_7$ is 5.140 g/cm$^3$ and the theoretical density of $YF_3$ is 5.063 g/cm$^3$) to calculate a relative density (%).

If pores exist in a material used for a member for semiconductor manufacturing apparatuses, the pores will corrode intensively, which may be a dust generation source. Therefore, the material used for a member for semiconductor manufacturing apparatuses is generally required to have a high density of 97.0% or more, or 99.0% or more of the relative density.

<2. Vickers Hardness>

Vickers hardness was measured with a test force of 0.5 gf using a Micro Vickers hardness tester HM-220 manufactured by Mitutoyo.

<3. Electrical Characteristics (Dielectric Dissipation Factor, Tan δ)>

Upper and lower surfaces of the produced sintered material were polished with #1000 water resistance paper. Thereafter, tan δ was measured by using a capacitance method using a measuring instrument in which a test fixture 16455B manufactured by Keysight was connected to an impedance analyzer 4294A manufactured by Keysight. In addition, in this measuring instrument, because the measurement of a value of tan δ in a region less than $1 \times 10^{-4}$ was unstable, the value of tan δ in this region was expressed as "$<1 \times 10^{-4}$".

<4. Impurities>

Impurities in the manufactured sintered material were confirmed using XRD (X-ray analysis device) SmartLab manufactured by RIGAKU.

<5. Particle Size of Sintered Material>

The manufactured sintered material was broken with a hammer, and a cross-section was observed using a SEM (Scanning Electron Microscope, SU8000, manufactured by Hitachi). From the SEM image, the "particle size (average section length La)" was calculated using a sectioning method, and a particle size multiplied by 1.62 was defined as a "particle size" (average crystal particle size D). Specifically, in the SEM image developed in an XY plane, total 9 lines having a length of L, including three straight lines at equal intervals in X and Y directions, respectively, were drawn, the number n of crystal grains traversed by each of these straight lines was obtained, and an average section length La and an average crystal grain size D were obtained using a relational formula below.

$$La = L/n$$

$$D = 1.62 \times La$$

<6. Plasma Resistance Test>

First, in order to flatten a surface state, a surface of the sintered material was polished using water resistance paper of #1000 to #4000, and planarized until an arithmetic surface roughness Ra of the surface was approximately 0.1 μm or less. Next, a region not exposed to plasma treatment was secured by covering about a half of the surface of the manufactured sintered material with polyimide tape. The sintered material to which the polyimide tape was attached was subjected to a plasma resistance test with a $CF_4/O_2$ mixed gas using an Inductively Coupled Plasma (ICP) etching apparatus (ICP Etcher) manufactured by SELVAC. Specifically, after setting an electrode size to 300 mm in diameter, pressure to 1 Pa, ICP power to 1500 W, bias power to 170 W, a gas flow rate of $CF_4$ to 180 mL/min, and a gas flow rate of $O_2$ to 45 mL/min, a plasma treatment was performed for 50 hours. After the plasma treatment, the sintered material was taken out and the polyimide tape was removed.

A step difference was measured at a boundary part near an end surface of the polyimide tape using a stylus-type surface shape measuring instrument Surfcom1400G manufactured by Tokyo Seimitsu, and the step difference was determined as an etching amount. In addition, for the part not covered by the polyimide tape, the arithmetic surface roughness (Ra) of the surface of the sintered material was measured before and after the plasma resistance test using a surface shape measuring instrument, and a deterioration rate of Ra was calculated by the following formula.

$$(Ra \text{ deterioration rate})=(Ra \text{ after plasma resistance test})/(Ra \text{ before plasma resistance test})$$

When a member for a semiconductor manufacturing apparatus is exposed to plasma, a part of the member falls off from the surface of the member, and particles are generated. The size of particles increases as the surface roughness of the member surface increases. That is, when the surface roughness of the member is small, the size of generated particles may be reduced, which is desirable. Therefore, even when the etching amount does not change, it may be stated that when the Ra deterioration rate is lower, the influence of particle generation by plasma exposure is smaller.

<Evaluation Result of Sintered Material>

Next, the evaluation results of the sintered material are described. As the evaluation results, the following items are described. 1. Evaluation result of sintered material by atmospheric pressure sintering, 2. Evaluation result of sintered material by Spark Plasma Sintering, 3. Evaluation result of sintered material by hot press molding, and 4. Evaluation result of plasma resistance test of sintered material.

<1. Evaluation Result of Sintered Material by Atmospheric Pressure Sintering>

FIG. 6 shows manufacturing conditions and evaluation results of sintered materials manufactured by using an example of a method of manufacturing a sintered material by atmospheric pressure sintering. Specifically, FIG. 6 shows manufacturing conditions and evaluation results of sintered materials manufactured according to Embodiments 1, 2, and 3 and Comparative Examples 1, 2, 3, and 4.

Comparing Embodiment 1 in which the raw material powder A having a particle size of 0.3 μm was sintered at 800° C. with Comparative Example 1 in which the raw material powder B having a particle size of 0.5 μm was sintered at 900° C., even though the sintering temperature is low, the sintered material according to Embodiment I had an increased density and hardness. It is considered that when a particle size of a raw material powder is small, densification proceeds at a lower temperature, and thus, the density and hardness are increased.

When comparing Comparative Example 1 with Comparative Example 4, in which the raw material powder B and the raw material powder C were sintered respectively under the same conditions, the density and hardness of the Comparative Example 4 were higher. This is considered as a result of lowering the sintering temperature by adding $YF_3$, and thus, increasing the density resulting in increased hardness.

In Embodiment 1 in which the raw material powder A having a particle size of 0.3 μm was sintered at 800° C., a $Y_5O_4F_7$ sintered material having a relative density of 99.0% or more and a hardness of 6.0 GPa or more was obtained. Because densification proceeds at a lower temperature when the particle size is reduced, it is seen that when the particle size is less than 0.3 μm, a sintered material with a relative density of 99.0% or more and a hardness of 6.0 GPa or more may be obtained even at a sintering temperature of 800° C. or less. Furthermore, values of tan δ of the sintered materials according to the embodiments were all favorable as small as $1×10^{-4}$ or less. Assuming that the hardness of the sintered material follows the so-called Hall-Petch relationship formula, it is considered that the smaller the particle size, the greater the hardness, and it is seen that, in order to realize a hardness of 6.0 GPa or more, it is necessary to set the particle size at least to 0.60 μm or less.

In Comparative Example 1 in which the raw material powder B was sintered at 900° C., the value of tan δ was small, but the relative density and hardness were insufficient. It is necessary to increase the sintering temperature to increase density; however, if the density follows the Hall-Petch relationship formula, the hardness is highly likely to decrease as grain growth proceeds. Therefore, it is considered that it is difficult to obtain a sintered material having sufficiently high relative density and hardness by atmospheric pressure sintering of the raw material powder B.

In Embodiments 2 and 3 in which the raw material powder C to which $YF_3$ was added was sintered at a temperature in a range of about 825° C. to about 850° C., sintered materials having a relative density of 99.0% or more and a hardness of 5.0 GPa or more were obtained. Because densification proceeds at a lower temperature when the particle size is reduced, if the particle size of the raw material powder is formed as less than 0.5 μm, a sintered material with a relative density of 99.0% or more and a hardness of 5.0 GPa or more may be obtained even in a temperature range lower than the temperature range of 825° C. to 850° C. Furthermore, the values of tan δ of the sintered materials according to the embodiments are all favorable as small as $1×10^{-4}$ or less. In Comparative Example 4 in which the raw material powder C was sintered at 900° C., the values of density and tan δ were favorable, but the hardness was less than 5.0 GPa, which is insufficient. The particle size of Comparative Example 4 was greater than that of Embodiments 1 and 2. This is considered as a result of proceeding grain growth due to the increase in the sintering temperature, resulting in a decrease in hardness. In order to realize a hardness of 5.0 GPa or more, it is seen that the particle size may be at least 1.27 μm or less.

When paying attention to tan δ of Embodiments 1 to 3 and Comparative Examples 1 to 4, sufficiently small values were obtained except for Comparative Example 2 having a low density. In order to make the value of tan δ be $10×10^{-4}$ or less, it is seen that the density may be at least 96.3% or more.

As a result of XRD analysis of the sintered materials according to Embodiments 1 to 3 and Comparative Examples 1 to 4, only an orthorhombic $Y_5O_4F_7$ phase was found from the sintered materials using the raw material powder A and the raw material powder B, only orthorhombic $Y_5O_4F_7$ and orthorhombic $YF_3$ phases were detected from the sintered material using the raw material powder C, and no impurities were observed.

As shown in FIG. 6, the sintered materials according to Embodiments 1 to 3 and Comparative Examples 1 to 4 were determined as "defective" (x) if the density is less than 97.0% or the hardness is less than 5.0 GPa, determined as "favorable" (○) if the density is 97.0% or more and less than 99.0%, the hardness is 5.0 GPa or more, or the density is 99.0% or more and the hardness is 5.0 GPa or more and less than 6.0 GPa, and determined as "excellent" (◎) if the density is 99.0% or more and the hardness is 6.0 GPa or more.

<2. Evaluation Result of Sintered Material Manufactured by Spark Plasma Sintering>

FIG. 7 shows manufacturing conditions and evaluation results of a sintered material manufactured using an example of a method of manufacturing a sintered material by Spark Plasma Sintering. Specifically, FIG. 7 shows manufacturing conditions and evaluation results of the sintered materials manufactured according to Embodiments 4 to 11 and Comparative Examples 5 to 7.

When comparing Embodiment 6 with Comparative Example 6, and Embodiment 9 with Embodiment 10, which are combinations in which the raw material powder A and the raw material powder B were sintered under the same conditions, respectively, in Embodiments 6 and 9 using the raw material powder A, the density and hardness were large. This is considered as having occurred because the density increased as a result of lowering the sintering temperature due to the small particle size of the raw material powder.

Comparing the Comparative Example 7 with Embodiment 11, in which the raw material powder B and the raw material powder C were sintered under the same conditions, the raw material powder C has a large density and hardness and a small particle size. This is considered as a result of lowering the sintering temperature by adding $YF_3$, resulting in densification while suppressing grain growth, and thus, the density and hardness were increased.

In Embodiments 4 to 7 and 9, in which the raw material powder A was sintered at a temperature in a range from about 800° C. to about 850° C. under a vacuum atmosphere, a $Y_5O_4F_7$ sintered material having a relative density of 99.0% or more and a hardness of 6.0 GPa or more was obtained. Also, in Embodiment 8 in which the raw material powder A was sintered at 800° C. under an Ar atmosphere, a $Y_5O_4F_7$ sintered material having a relative density of 99.0% or more and a hardness of 5.0 GPa or more was obtained. It is seen that when the particle size of the raw material powder is formed as less than 0.3 μm, it is possible to obtain a sintered material having a relative density of 99.0% or more and a hardness of 6.0 GPa or more even in a temperature range less than 800° C. to 850° C. Furthermore, values of tan δ of the sintered materials according to the embodiments were all favorable as small as $1 \times 10^{-4}$ or less. It is seen that, in order to realize a hardness of 6.0 GPa or more, it is desirable to set the particle size to at least 1.05 μm or less, and in order to realize a hardness 5.0 GPa or more, it is desirable to set the particle size to at least 1.15 μm or less. From the results of Embodiment 8, it is seen that a sintered material having sufficiently high relative density and hardness and small dielectric dissipation factor may be obtained not only in a vacuum atmosphere but also in sintering under an Ar atmosphere.

In Embodiment 10 in which the raw material powder B was sintered at 850° C., a $Y_5O_4F_7$ sintered material according to an aspect of an embodiment was obtained with a relative density of 97.0% or more and a hardness of 5.0 GPa or more. It is seen that when the particle size of the raw material powder is reduced to below 0.5 μm, a sintered material having a relative density of 97.0% or more and a hardness of 5.0 GPa or more may be obtained even in a temperature region lower than 850° C. Furthermore, the value of tan δ of the sintered material according to Embodiment 10 was favorable as small as $1 \times 10^{-4}$ or less. In order to realize a hardness of 5.0 GPa or more, it is seen that it is desirable to set the particle size to at least 0.86 μm or less. In Comparative Example 6 in which the sintering temperature was less than in Embodiment 10, the density is low, and thus, the hardness is also low. In Comparative Example 7 in which the sintering temperature was greater than in Embodiment 10, although the density was slightly increased, a decrease in hardness presumed to be due to grain growth was observed.

In Embodiment 11 in which the raw material powder C to which $YF_3$ was added was sintered at a temperature of 900° C., a $Y_5O_4F_7$ sintered material according to an aspect of an embodiment was obtained with a relative density of 99.0% or more and a hardness of 5.0 GPa or more. It is seen that when the particle size of the raw material powder is formed as less than 0.5 μm, a sintered material having a relative density of 99.0% or more and a hardness of 5.0 GPa or more may be obtained even in a temperature range less than 900° C. In order to realize a hardness of 5.0 GPa or more, it is desirable to set the particle size to at least 1.07 μm or less. Furthermore, the value of tan δ of the sintered material according to Embodiment 11 was favorable as small as $1 \times 10^{-4}$ or less.

When paying attention to the tan δ of Embodiments 4 to 11 and Comparative Examples 5 to 7, sufficiently small values of tan δ were obtained for all sintered materials. It is seen that the density may be at least 95.8% or more in order to set the value of tan δ to $10 \times 104$ or less, and at least 96.8% or more in order to set the tan δ value to $1 \times 10^{-4}$ or less.

As a result of XRD analysis of the sintered materials according to Embodiments 4 to 11 and Comparative Examples 5 to 7, from the sintered materials using the raw material powder A and the raw material powder B, only orthorhombic $Y_5O_4F_7$ phase was found, and from the sintered material using the raw material powder C, only orthorhombic $Y_5O_4F_7$ and orthorhombic $YF_3$ phases were detected, and no impurities were observed.

<3. Evaluation Result of Sintered Material by Hot Press Molding>

FIG. 8 shows manufacturing conditions and evaluation results of a sintered material manufactured using an example of a method of manufacturing a sintered material by hot press molding. Specifically, FIG. 8 shows the manufacturing conditions and evaluation results of the sintered materials manufactured in Embodiments 12 to 19 and Comparative Examples 8 to 14.

Comparing Embodiment 13 with Comparative Example 8, and Embodiment 14 with Embodiment 16, which are combinations in which the raw material powder A and the raw material powder B were sintered under the same conditions, respectively, in Embodiments 13 and 14 using the raw material powder A, the density and hardness were increased. This is considered as having occurred because the density increased as a result of lowering the sintering temperature due to the small particle size of the raw material powder.

Comparing the combinations obtained by sintering the raw material powder B and the raw material powder C under the same conditions, in general, the raw material powder C tends to have a greater density. It is considered that such occurs because the sintering temperature is reduced by adding $YF_3$.

In Embodiments 13 and 14 in which the raw material powder A was sintered at a temperature in a range from about 750° C. to about 800° C., sintered materials having a relative density of 99.0% or more and a hardness of 6.0 GPa or more were obtained. Also, in Embodiment 12 in which the raw material powder A was sintered at 700° C., a $Y_5O_4F_7$ sintered material having a relative density of 97.0% or more and a hardness of 6.0 GPa or more was obtained. It is seen that when the particle size of the raw material powder is less than 0.3 μm, a sintered material having a relative density of 97.0% or more and a hardness of 6.0 GPa or more may be obtained even in a temperature range less than a range from about 700° C. to about 800° C. Furthermore, the values of tan δ of the sintered materials according to the embodiments were all favorable as small as 10×104 or less. It is seen that in order to realize a hardness 5.0 GPa or 6.0 GPa or more, it is desirable to set the particle size at least to 0.42 μm or less.

In Embodiment 15 in which the raw material powder B was sintered at 780° C., a $Y_5O_4F_7$ sintered material having a relative density of 97.0% or more and a hardness of 6.0 GPa or more was obtained. Furthermore, in Embodiments 16 and 17 in which the raw material powder B was sintered at a temperature in a range from about 800° C. to about 850° C., $Y_5O_4F_7$ sintered materials having a relative density of 99.0% or more and a hardness of 5.0 GPa or more were obtained, respectively. It is seen that when the particle size of the raw material powder is less than 0.5 μm, a sintered material having sufficiently high relative density and hardness may be obtained even in a temperature range less than a range from about 780° C. to about 850° C. It is seen that at least the particle size is 0.89 μm or less to realize a hardness of 5.0 GPa or more, and at least 0.57 μm or less to realize a hardness of 6.0 GPa or more. Furthermore, the value of tan δ of the sintered material according to the embodiments was favorable as small as $1\times10^{-4}$ or less. In Comparative Example 8, which had a lower sintering temperature than Embodiment 15, the density was low. In Comparative Examples 9 and 10, which had a higher sintering temperature than Embodiment 17, although the density was high, a decrease in hardness, which was attributed to grain growth, was observed.

In Embodiments 18 and 19 in which the raw material powder C, to which $YF_3$ was added, was sintered at a temperature range from about 750° C. to about 800° C., $Y_5O_4F_7$ sintered materials having a relative density of 99.0% or more and a hardness of 5.0 GPa or more were obtained, respectively. It is seen that when the particle size of the raw material powder is less than 0.5 μm, a sintered material having a relative density of 99.0% or more and a hardness of 5.0 GPa or more may be obtained even in a temperature range lower than a range from about 750° C. to about 800° C. It is seen that it is desirable to set the particle size at least to 0.49 μm or less to realize a hardness of 5.0 GPa or more. Furthermore, the value of tan δ of the sintered material according to Embodiments 18 and 19 was good as small as $1\times10^{-4}$ or less.

When paying attention to the tan δ of Embodiments 12 to 19 and Comparative Examples 8 to 14, sufficiently small values of tan δ were obtained in all sintered materials except for Comparative Examples 8 and 11, which had low densities. It is seen that the density may be at least 98.1% or more to have the value of tan δ to $10\times10^{-4}$ or less, and at least 98.4% or more to have the value of tan δ to $1\times10^{-4}$ or less.

As a result of XRD analysis of the sintered materials according to Embodiments 12 to 19 and Comparative Examples 8 to 14, from the sintered material using the raw material powder A and the raw material powder B, only an orthorhombic $Y_5O_4F_7$ phase was found, and from the sintered material using the raw material powder C, only orthorhombic $Y_5O_4F_7$ and orthorhombic $YF_3$ phases were detected, and no impurities were observed.

<4. Consideration of Property Values>
<4-1. Effect of Particle Size on Hardness>

In general, the higher the density, the higher the hardness. However, when the relative density is 97.0% or more as in the sintered material according to an aspect of an embodiment, the particle size has a large effect on the hardness compared to the relative density.

As a relationship between the particle size and hardness, there is a Hall-Petch relationship, and it is known that it may be applied to most metal materials. However, it is stated that the Hall-Petch relationship may not be theoretically applicable to ceramics like the sintered material of an aspect of an embodiment. When the embodiments and comparative examples are viewed, it may not be strictly determined whether the Hall-Petch relationship is applicable, but at least, as in the Hall-Petch relationship, the tendency for hardness to increase as the particle size decreases is seen. Therefore, the particle size of the sintered material according to an aspect of an embodiment is considered. In general, because it is considered that the hardness of a sintered material is also greatly influenced by the composition of a material, a study was conducted for each raw material powder. As described above, the raw material powder A and the raw material powder B include only $Y_5O_4F_7$, and the raw material powder C is a mixture of $Y_5O_4F_7$ and $YF_3$.

<4-1-1. Particle Size Satisfying Hardness of 5.0 GPa or More>

As shown in FIG. 6, when the particle size of a sintered material manufactured by atmospheric pressure sintering of the raw material powder C was at least 1.27 μm or less, the hardness of the sintered material was 5.0 GPa or more.

As shown in FIG. 7, when the particle size of the sintered material manufactured by spark plasma sintering of the raw material powder A was at least 1.15 μm or less, the hardness of the sintered material was 5.0 GPa or more. When the particle size of the sintered material manufactured by spark plasma sintering of the raw material powder B was at least 0.86 μm or less, the hardness of the sintered material was 5.0 GPa or more. When the particle size of the sintered material manufactured by spark plasma sintering of the raw material powder C was at least 1.07 μm or less, the hardness of the sintered material was 5.0 GPa or more.

As shown in FIG. 8, when the particle size of the sintered material manufactured by hot press molding of the raw material powder B was at least 0.89 μm or less, the hardness of the sintered material was 5.0 GPa or more. When the particle size of the sintered material manufactured by hot press molding of the raw material powder C was at least 0.49 μm or less, the hardness of the sintered material was 5.0 GPa or more.

From the above results, it may be stated that, in the sintered material according to an aspect of an embodiment mainly including $Y_5O_4F_7$, the particle size at which the hardness is 5.0 GPa or more is at least 1.15 μm or less, or 0.86 μm or less. In addition, in the sintered material including $Y_5O_4F_7$ to which $YF_3$ is added, according to an aspect of an embodiment, the particle size at which the hardness is 5.0 GPa or more is at least 1.27 μm or less, or 0.49 μm or less.

<4-1-2. Particle Size that Satisfies Hardness of 6.0 GPa or More>

As shown in FIG. 6, when the particle size of the sintered material manufactured by atmospheric pressure sintering of the raw material powder A was at least 0.42 μm or less, the hardness of the sintered material was 6.0 GPa or more.

As shown in FIG. 7, when the particle size of the sintered material manufactured by spark plasma sintering of the raw material powder A was at least 1.05 μm or less, the hardness of the sintered material was 6.0 GPa or more.

As shown in FIG. 8, when the particle size of the sintered material manufactured by hot press molding of the raw material powder A was at least 0.42 μm or less, the hardness of the sintered material was 6.0 GPa or more. When the particle size of the sintered material manufactured by hot press molding of the raw material powder B was at least 0.57 μm or less, the hardness of the sintered material was 6.0 GPa or more.

From the above results, it may be stated that in the sintered material according to an embodiment mainly including $Y_5O_4F_7$, the particle size at which the hardness is 6.0 GPa or more is at least 1.05 μm or less, or 0.42 μm or less. Furthermore, in the sintered material including $Y_5O_4F_7$ to which $YF_3$ is added, according to an aspect of an embodiment, the particle size at which the hardness is 6.0 GPa or more is at least 1.27 μm or less, or 0.49 μm or less.

<4-2. Effect of Density on Tan δ>

In dielectric materials, in general, tan δ is said to be greatly influenced by the state of grain boundaries, specifically, the state of additives and impurities that aggregate at grain boundaries, and voids present in the interior of the sintered material. Therefore, the tan δ of the sintered material according to an aspect of an embodiment was studied with attention to the sintering method and density.

<4-2-1. Density that Satisfies Tan δ of $10 \times 10^{-4}$ or Less>

As shown in FIG. 6, when the density of the sintered material manufactured by atmospheric pressure sintering of raw material powder A, B, or C was at least 96.3%, the value of tan δ was $10 \times 10^{-4}$ or less.

As shown in FIG. 7, when the density of the sintered material manufactured by spark plasma sintering of the raw material powder A, B or C was at least 95.8% or more, the value of tan δ was $10 \times 10^{-4}$ or less.

As shown in FIG. 8, when the density of the sintered material manufactured by hot press molding of the raw material powder A, B or C was at least 98.1%, the value of tan δ was $10 \times 10^{-4}$ or less.

From the above results, in the sintered material according to an aspect of an embodiment, it may be stated that the density at which the value of tan δ is $10 \times 10^{-4}$ or less is at least 95.8% or more, or 98.1% or more.

<4-2-2. Density that Satisfies Tan δ of $1 \times 10^{-4}$ or Less>

As shown in FIG. 6, when the density of the sintered material manufactured by atmospheric pressure sintering of the raw material powder A, B or C was at least 96.3%, the value of tan δ was $1 \times 10^{-4}$ or less.

As shown in FIG. 7, when the density of a sintered material manufactured by spark plasma sintering of raw material powder A, B or C was at least 96.8%, the value of tan δ was $1 \times 10^{-4}$ or less.

As shown in FIG. 8, when the density of the sintered material manufactured by hot press molding of the raw material powder A, B or C was at least 98.4% or more, the value of tan δ was $1 \times 10^{-4}$ or less.

From the above results, in the sintered material according to an aspect of an embodiment, it may be stated that the density at which the value of tan δ is $1 \times 10^{-4}$ or less is at least 96.3% or more, or 98.4% or more. As described above, a high density is desirable from a viewpoint of dust generation properties, and specifically, the density is desirably at least 97.0% or more, or 99.0% or more.

<5. Evaluation Result of Plasma Resistance Test of Sintered Material>

FIG. 9 shows results of plasma resistance test of sintered materials.

In addition, in Comparative Example 15, a $Y_2O_3$ sintered material (model number YO100A, a commercially available product of Kyocera) was used. For comparison, a plasma resistance test was similarly performed on the $Y_2O_3$ sintered material according to Comparative Example 15. Values of relative density and hardness of Comparative Example 15 are obtained from the manufacturer's catalog. In addition, the relative density is a value divided by a theoretical density of $Y_2O_3$.

As shown in FIG. 9, the sintered material according to an embodiment has the same etching amount or less and the change in surface roughness is small compared to the $Y_2O_3$ sintered material according to the Comparative Example 15. Therefore, the $Y_5O_4F_7$ sintered material according to an aspect of an embodiment has high plasma resistance compared to the $Y_2O_3$ sintered material in general, and in particular, it may be stated that it is superior from a viewpoint of reducing an amount of dust, which is a significant factor. In particular, in the sintered material according to the embodiment using the raw material powder A and the raw material powder B, the change in surface roughness is ⅓ or less compared to the $Y_2O_3$ sintered material, and it is seen that the effect of reducing the size of generated particles is significant.

The sintered material according to Comparative Example 11 having a relative density of less than 97% had a large etching amount and Ra deterioration rate compared with a sintered material according to Embodiments. In addition, the sintered materials according to Comparative Examples 4, 10, and 12 having a hardness of less than 5.0 GPa also had a large etching amount and Ra deterioration rate compared with the sintered material according to Embodiments.

Effects of an Aspect of an Embodiment

Because a $Y_5O_4F_7$ sintered material according to an aspect of an embodiment has a lower reactivity with respect to a halogen gas compared to a $Y_2O_3$ sintered material, chemical corrosion is suppressed. Furthermore, because the $Y_5O_4F_7$ sintered material according to an aspect of an embodiment has a high density equivalent to that of the $Y_2O_3$ sintered material and has a hardness equal to or greater than that of the $Y_2O_3$ sintered material, physical corrosion is also suppressed. The $Y_5O_4F_7$ sintered material according to an aspect of an embodiment may be expected as a next-generation corrosion-resistant material replacing $Y_2O_3$. In addition, because the $Y_5O_4F_7$ sintered material according to an aspect of an embodiment has a small value of tan δ, heat generation of the member is small, and also, the plasma state is stable. Therefore, the $Y_5O_4F_7$ sintered material according to an aspect of an embodiment has advantages in saving electricity by reducing power-loss, stabilization of etching rate, reduction of etching unevenness, reduction of labor required for tuning, prevention of plasma dispersion, etc.

($Y_5O_4F_7$ and Yttrium Oxyfluoride Powder)

Figure 10:
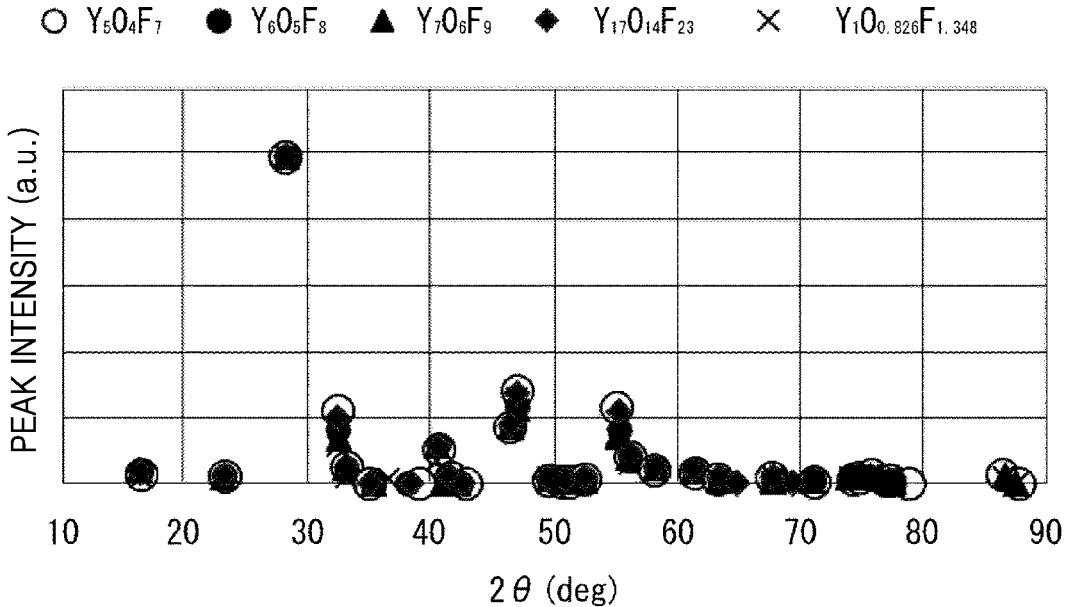
FIG. 10 is a graph showing a peak intensity of yttrium oxyfluoride powder X-ray diffraction by the International Center for Diffraction Data (ICDD)

Next, the yttrium oxyfluoride powder will be described. FIG. 10 is a graph showing a peak intensity of yttrium oxyfluoride powder X-ray diffraction by the International Center for Diffraction Data (ICDD).

In an embodiment, a substance denoted as "$Y_5O_4F_7$" is a substance classified as "$Y_5O_4F_7$" as a result of XRD analysis. As for yttrium oxyfluoride, a substance in which Y, O, and F are combined in various ratios is known, and these substances are similar in element composition and crystal structure to $Y_5O_4F_7$, and it is seen that the sintered material using the yttrium oxyfluoride also exhibits the same effect as the $Y_5O_4F_7$ according to an aspect of an embodiment.

For example, according to the database of powder X-ray diffraction patterns by ICDD, examples of a compound having a structure similar to $Y_5O_4F_7$ described in aspects of embodiments may include $Y_6O_5F_8$, $Y_7O_6F_9$, $Y_{17}O_{14}F_{23}$, and $Y_1O_{0.826}F_{1.348}$. The X-ray diffraction peaks of these yttrium oxyfluoride powders described in the database are shown in FIG. 10. In addition, in FIG. 10, when the maximum peak is 100 among substances, a peak less than 1 is not plotted. As shown in FIG. 10, it is seen that the X-ray diffraction peaks of these five yttrium oxyfluorides including $Y_5O_4F_7$ have very similar peak positions and peak intensities. For example, values of $2\theta$, at which the peaks are maximum, are 28.11°, 28.14°, 28.14°, 28.14°, 28.13°, and 28.13° in the order of $Y_5O_4F_7$, $Y_6O_5F_8$, $Y_7O_6F_9$, $Y_{17}O_{14}F_{23}$, and $Y_1O_{0.826}F_{1.348}$, and are close to each other. In actual X-ray diffraction measurement, it is practically difficult to completely specify these five substances because the peak intensity changes or the peak position is shifted depending on the state of the measured sample or the measurement error of the apparatus.

From the above reasons, the substance denoted as "$Y_5O_4F_7$" according to an aspect of an embodiment includes these similar yttrium oxyfluorides.

In addition, in general, in the manufacture of ceramics, sintering ability is increased or a microstructure of the sintered material is controlled by adding an "additive" in an amount of several wt % to 10 wt % in addition to the base material. For example, in Non-Patent Document 5, a method of controlling the microstructure of SiAlON ceramics by adding a rare earth element and improving optical properties by reducing the particle size is disclosed.

In aspects of embodiments, although it is described that there is an effect similar to that of Non-Patent Document 5 by adding $YF_3$, it is seen that the same effect as that of $YF_3$ is obtained even if an additive as disclosed in Non-Patent Document 5 is used. In the case when an additive is included, it is defined as "substantially includes $Y_5O_4F_7$". It is also possible to control particle size and to reduce dust generation by using an additive. If the particle size is reduced, as in an aspect of an embodiment, hardness may be greatly increased, and physical corrosion resistance may be improved. In addition, if the diameter is reduced, the size of dust generating particles may be reduced.

In an aspect of an embodiment, it is desirable that the material used as an additive has high plasma resistance like $Y_5O_4F_7$. In general, rare earth elements (Sc, La, Ce, Pr, Nd, Pm, Sm, Eu, Gd, Tb, Dy, Ho, Er, Tm, Yb, Lu) have a relatively low vapor pressure of compounds with halogens compared with other elements, and have a high plasma resistance. Oxides, fluorides, and acid fluorides, which are stable compounds of these elements, are desirable as an additive added in an aspect of an embodiment.

Embodiment IV

Figure 11:
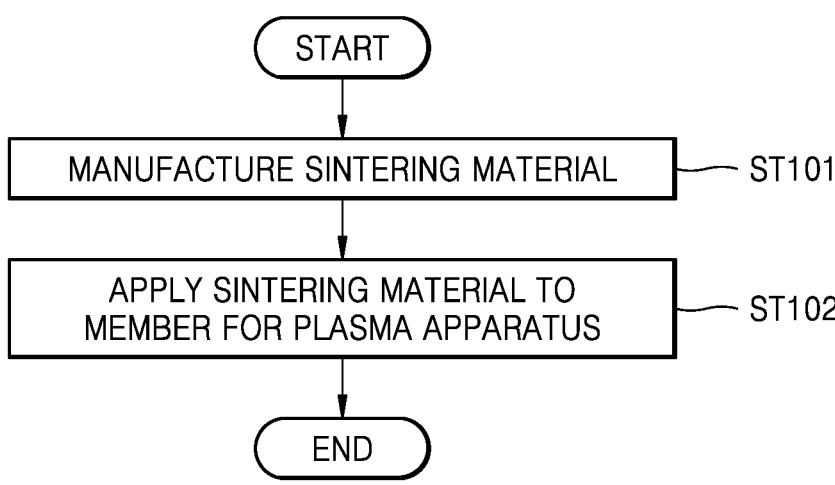
FIG. 11 is a flowchart of a method of manufacturing a member for a semiconductor manufacturing apparatus according to a fourth aspect of an embodiment.

Next, a member for a semiconductor manufacturing apparatus according to Embodiment IV and a method of manufacturing the same are described. FIG. 11 is a flowchart showing a method of manufacturing a member for a semiconductor manufacturing apparatus according to Embodiment IV.

The member for a semiconductor manufacturing apparatus according to Embodiment IV is a member for a plasma apparatus using a sintered material. The sintered material is manufactured by using the method of manufacturing a sintered material according to Embodiment I, II, or III. The member for a plasma apparatus includes, for example, an edge ring, a shower nozzle, or a window. The window may be a member that transmits at least an electric wave.

First, a sintered material is manufactured (operation ST101). Specifically, the sintered material is manufactured using the method of manufacturing a sintered material according to Embodiment I, II, or III.

Furthermore, the sintered material manufactured in operation ST101 is applied to a member for a plasma apparatus (operation ST102). The member for a plasma apparatus may be used as a member for semiconductor manufacturing apparatuses. From the above, the member for a semiconductor manufacturing apparatus may be manufactured.

Embodiment V

Figure 12:
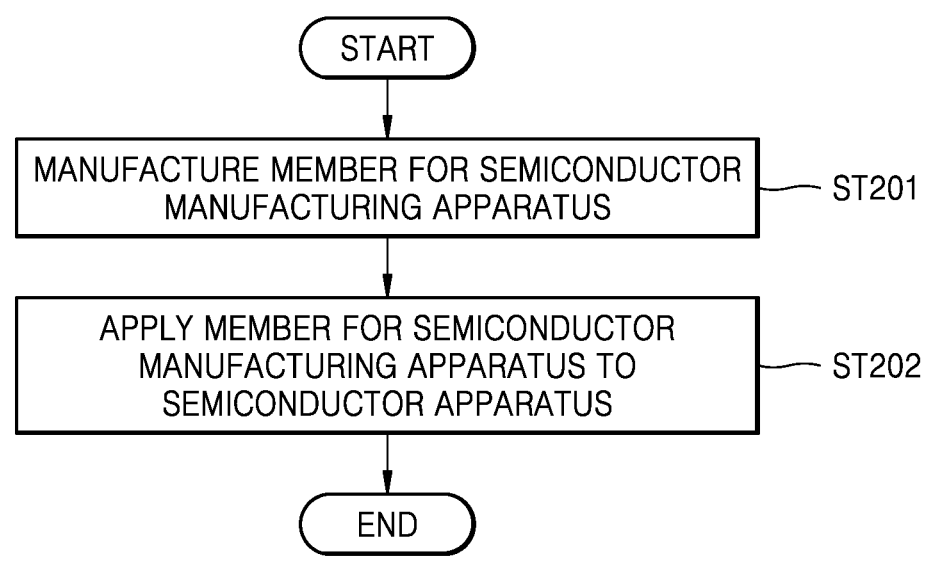
FIG. 12 is a flowchart showing a method of manufacturing a semiconductor manufacturing apparatus according to a fifth aspect of an embodiment.

Next, a semiconductor manufacturing apparatus according to Embodiment V and a method of manufacturing the same are described. FIG. 12 is a flowchart showing a method of manufacturing a semiconductor manufacturing apparatus according to Embodiment V.

The semiconductor manufacturing apparatus according to Embodiment V includes a member for the semiconductor manufacturing apparatus according to Embodiment IV described above.

First, a member for a semiconductor manufacturing apparatus is manufactured (operation ST201). Specifically, the member for a semiconductor manufacturing apparatus is manufactured using the method of manufacturing a member for a semiconductor manufacturing apparatus according to Embodiment IV.

Next, the member for a semiconductor manufacturing apparatus manufactured in operation ST201 is applied to a semiconductor manufacturing apparatus (operation ST202). From the above, a semiconductor manufacturing apparatus may be manufactured.

While aspects of embodiments have been particularly shown and described, it will be understood that various changes in form and details may be made therein without departing from the spirit and scope of the following claims.

What is claimed is:

1. A sintered material comprising 50 mass % or more of yttrium oxyfluoride and having a relative density of 97.0% or more and a Vickers hardness of 5.0 GPa or more, wherein the sintered material further comprises yttrium fluoride including an orthorhombic $YF_3$ phase.

2. The sintered material of claim 1, further comprising 10 mass % or less of at least one of an oxide of a rare earth element, a fluoride of a rare earth element, and an oxyfluoride of a rare earth element, wherein the rare earth element includes at least one of Sc, La, Ce, Pr, Nd, Pm, Sm, Eu, Gd, Tb, Dy, Ho, Er, Tm, Yb, and Lu.

3. The sintered material of claim 1, wherein the relative density is 99.0% or more.

4. The sintered material of claim 1, wherein an average particle size of crystal grains constituting the sintered material is 1.15 μm or less.

5. The sintered material of claim 1, wherein an average particle size of crystal grains constituting the sintered material is 1.27 pm or less.

6. The sintered material of claim 1, wherein the yttrium oxyfluoride includes an orthorhombic $Y_5O_4F_7$ phase.

7. The sintered material of claim 1, wherein a dielectric dissipation factor tan δ measured at 1 MHz is less than $10\times10^{-4}$.

8. A member for a plasma apparatus comprising the sintered material according to claim 1.

9. The member for a plasma apparatus of claim 8, wherein the member for a plasma apparatus includes an edge ring, a shower nozzle, or a window.

10. A semiconductor manufacturing apparatus configured to include a member for a plasma apparatus according to claim 8.

11. A method of manufacturing a sintered material according to claim 1, the method comprising:

molding a molded body including yttrium oxyfluoride powder having a particle size of 0.3 μm or less; and forming the sintered material by sintering the molded body under an atmospheric pressure at 800° C. or less.

12. A method of manufacturing a sintered material according to claim 1, the method comprising:

molding a molded body including yttrium oxyfluoride powder and yttrium fluoride powder having a particle size of 0.5 μm or less, and forming the sintered material by sintering the molded body under an atmospheric pressure at 850° C. or less.

13. A method of manufacturing a sintered material according to claim 1, the method comprising forming the sintered material by sintering a raw material powder including yttrium oxyfluoride powder having a particle size of 0.5 μm or less at 850° C. or less by using a spark plasma sintering method.

14. A method of manufacturing a sintered material according to claim 1, the method comprising forming the sintered material by sintering a raw material powder including yttrium oxyfluoride powder having a particle size of 0.3 μm or less at 800° C. or less by using a spark plasma sintering method.

15. A method of manufacturing a sintered material according to claim 1, the method comprising forming the sintered material by sintering a raw material powder including yttrium oxyfluoride powder and yttrium fluoride powder having a particle size of 0.5 μm or less at 900° C. or less by using a spark plasma sintering method.

16. A method of manufacturing a sintered material according to claim 1, the method comprising:

molding a molded body including yttrium oxyfluoride powder having a particle size of 0.5 μm or less; and forming the sintered material by sintering the molded body by hot press molding at 850° C. or less.

17. A method of manufacturing a sintered material according to claim 1, the method comprising:

molding a molded body including yttrium oxyfluoride powder having a particle size of 0.3 μm or less; and forming the sintered material by sintering the molded body by hot press molding at 800° C. or less.

18. A method of manufacturing a sintered material according to claim 1, the method comprising:

molding a molded body including yttrium oxyfluoride powder and yttrium fluoride powder having a particle size of 0.5 μm or less; and forming the sintered material by sintering the molded body by hot press molding at 800° C. or less.

19. The sintered material of claim 1, wherein a dielectric dissipation factor tan δ measured at 1 MHz is less than $1\times10^{-4}$.

* * * * *